(12) United States Patent
Yuan et al.

(10) Patent No.: US 10,192,885 B2
(45) Date of Patent: Jan. 29, 2019

(54) SEMICONDUCTOR ON INSULATOR (SOI) BLOCK WITH A GUARD RING

(71) Applicant: NXP USA, Inc., Austin, TX (US)

(72) Inventors: Chi-Min Yuan, Austin, TX (US); David R. Tipple, Leander, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/664,286

(22) Filed: Jul. 31, 2017

(65) Prior Publication Data

US 2017/0330899 A1 Nov. 16, 2017

Related U.S. Application Data

(62) Division of application No. 15/138,978, filed on Apr. 26, 2016, now Pat. No. 9,754,966.

(51) Int. Cl.

| | |
|---|---|
| *H01L 27/12* | (2006.01) |
| *H01L 21/8238* | (2006.01) |
| *H01L 21/84* | (2006.01) |
| *H01L 23/528* | (2006.01) |
| *H01L 27/092* | (2006.01) |
| *H01L 29/06* | (2006.01) |

(52) U.S. Cl.
CPC .. *H01L 27/1207* (2013.01); *H01L 21/823892* (2013.01); *H01L 21/84* (2013.01); *H01L 23/528* (2013.01); *H01L 27/0928* (2013.01); *H01L 29/0619* (2013.01); *H01L 29/0649* (2013.01)

(58) Field of Classification Search
CPC ................. H01L 21/76297; H01L 21/7624
See application file for complete search history.

(56) References Cited

U.S. PATENT DOCUMENTS

| | | | |
|---|---|---|---|
| 8,541,845 B2 | 9/2013 | Schuetz et al. | |
| 2010/0109090 A1 | 5/2010 | Zitouni et al. | |
| 2012/0018804 A1* | 1/2012 | Khemka | H01L 29/1083 257/337 |
| 2012/0074515 A1* | 3/2012 | Chen | H01L 23/585 257/491 |

* cited by examiner

*Primary Examiner* — Elias M Ullah

(57) ABSTRACT

A semiconductor device includes a bulk substrate of a first conductivity type, a first semiconductor on insulator (SOI) block in the bulk substrate, a first well of the first conductivity type in the first SOI block, a second well of a second conductivity type in the first SOI block, a first guard ring of the first conductivity type in the first SOI block around at least a portion of a periphery of the first SOI block, and a second guard ring of the second conductivity type in the first SOI block around at least a portion of the periphery of the first SOI block. The first conductivity type is different than the second conductivity type.

19 Claims, 4 Drawing Sheets

SEMICONDUCTOR ON INSULATOR (SOI) BLOCK WITH A GUARD RING

BACKGROUND

Field

This disclosure relates generally to semiconductor on insulator (SOI) devices, and more specifically, SOI devices with a guard ring.

Related Art

During semiconductor processing, electrical charges are collected by metal wires within the integrated circuit being manufactured. These electrical charges can cause damage to the gate oxides. This collection of electrical charges is typically referred to as the antenna effect. For bulk technologies, metal wires are connected to the source/drain regions of a transistor to discharge these collected charges to the bulk substrate. However, with SOI devices, this solution is not available. Firstly, in SOI devices, the sources and drains are insulated from the bulk substrate by a buried oxide (BOX) layer, thus not serving as good discharge paths for the charges. Furthermore, it may be desirable to dynamically switch between forward body biasing and reverse body biasing, which prevents traditional antenna diodes from properly discharging the charges. Therefore, a need exists for addressing the antenna effect in SOI devices.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An SOI block is a block of circuitry which includes one or more 501 devices. The SOI block is formed in a bulk substrate. The SOI block includes n-type wells and p-type wells which are formed in the bulk substrate. A buried oxide (BOX) layer is formed over these wells, and the SOI devices are formed over the BOX layer. Each of a first and a second guard ring, having opposite conductivity types, at least partially surrounds a periphery of the SOI block. The guard rings are formed in the bulk substrate and provide a diode with a large area to sufficiently dissipate the charges accumulated during manufacture. Furthermore, this design allows the SOI devices to be forward or reverse biased, as needed, during circuit operation.

Figure 1:
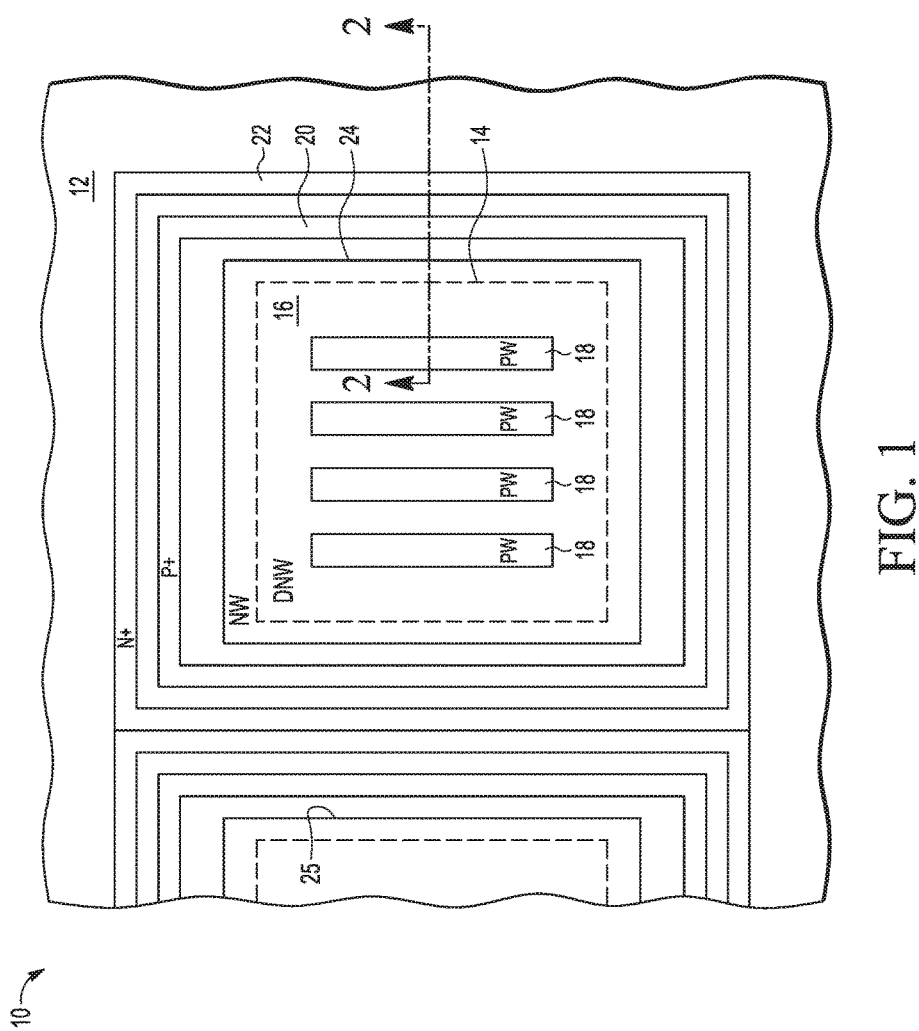
FIG. 1 illustrates, in a top-down view, a semiconductor device having an SOI block and corresponding guard rings, in accordance with one embodiment of the present invention.

FIG. 1 illustrates, in a top-down view, a semiconductor device 10 having an SOI block 24 and corresponding guard rings 20 and 22, in accordance with one embodiment of the present invention. SOI block 24 is formed within deep n-type well (deep N well) 14 which is formed within p-type bulk substrate 12. Within deep N well 14 is an n-type well (N well) 24 which includes a plurality of isolated p-type wells (P wells) 18. The isolated P wells are isolated from p-type substrate 12 by deep N well 14. Deep N well 14 therefore extends under P wells 18 and under N well 16, and extends to completely surround all of isolated P wells 18. In the illustrated embodiment, the boundary of deep N well 14 does not extend all the way to the boundary of N well 16, by in alternate embodiments, can extend to the boundary of N well 16 or beyond. As will be seen in the cross-sections of FIGS. 2-4, SOI devices are formed over N well 16 and isolated P wells 18.

Still referring to FIG. 1, the boundary of SOI block 24 is coincident with the boundary of N well 16. However, the boundary of SOI block 24 may be within the boundary of N well 16, so long as all the SOI devices of SOI block 24 are within the boundary of N well 16. A first guard ring 20 is located around and spaced apart from N well 16 and SOI block 24, and a second guard ring 22 is located around and spaced apart from first guard ring 20. In the illustrated embodiment, guard ring 20 completely and contiguously surrounds a periphery of N well 16 and a periphery of SOI block 24, and guard ring 22 completely and contiguously surrounds a periphery of guard ring 20. However, in alternate embodiments, guard ring 20 only partially surrounds a periphery of SOI block 24 or guard ring 22 only partially surrounds a periphery guard ring 20. Also, in alternate embodiments, either guard ring 20 or 22 can be non-contiguous. Guard ring 20 and guard ring 22 have opposite conductivity types. In one embodiment, guard ring 20 is a heavily doped p-type (P+) guard ring, and guard ring 22 is a heavily doped n-type (N+) guard ring. Therefore, each of guard rings 20 and 22 may also be referred to as a doped ring.

Also illustrated in FIG. 1 is a neighboring SOI block 25. The same descriptions provided to SOI block 24 apply to SOI block 25, including the descriptions of the underlying N well, isolated P wells, and deep N well. SOI block 25 also includes a first guard ring surrounding SOI block 25, and a second guard ring surrounding the first guard ring. Note that neighboring second guard rings can be shared at bordering edges.

Figure 2:
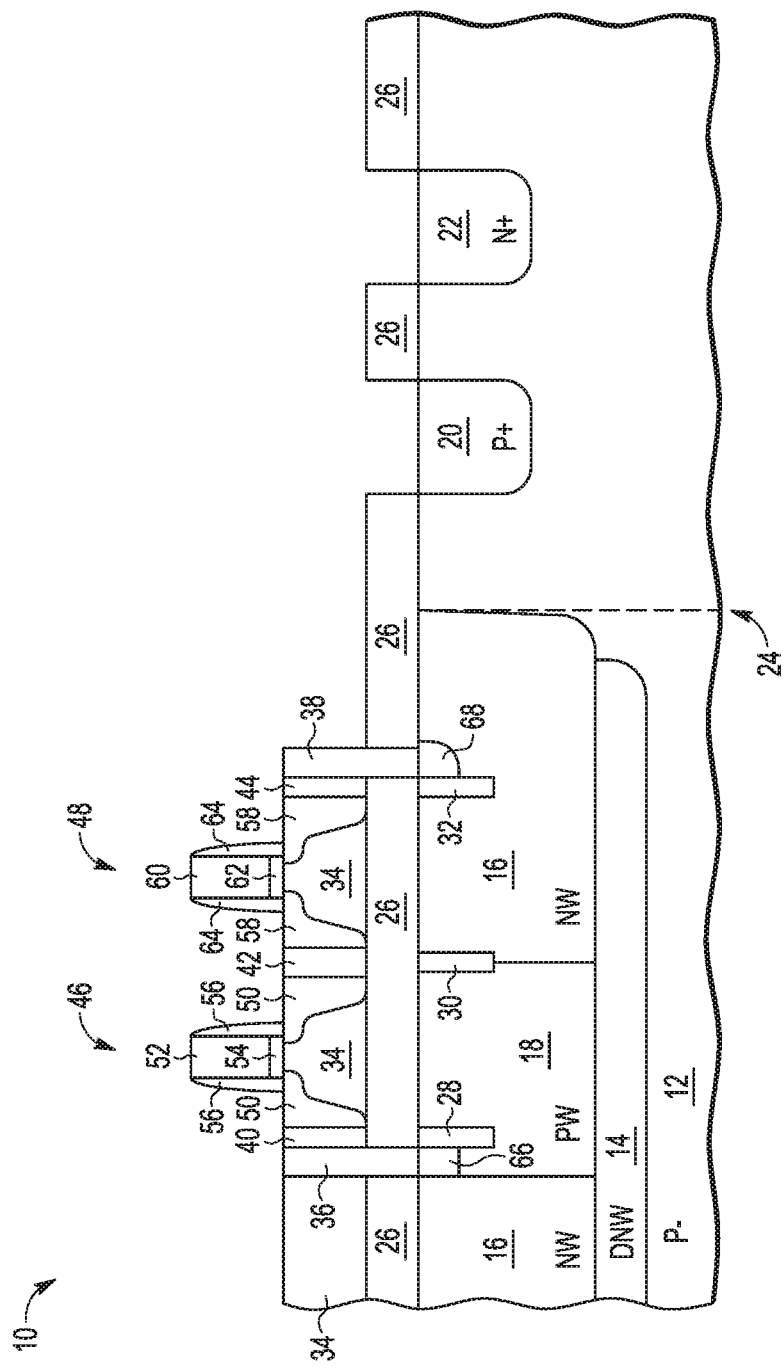
FIG. 2 illustrates, in a cross-sectional view, a cross section of the semiconductor device of FIG. 1, in accordance with one embodiment of the present invention.

FIG. 2 illustrates a cross section of semiconductor device 10 of FIG. 1, in accordance with one embodiment of the present invention, taken at the cross section line indicated in FIG. 1. Device 10 includes substrate 12, as described above, and can by any semiconductor material or combinations of materials, such as silicon, gallium arsenide, silicon germanium, or the like. As stated above, substrate 12 is a p-type bulk substrate. As can be seen in the cross section of FIG. 1, deep N well extends deeper into substrate 12 than isolated P wells 18 and N well 16. Substrate 12 also includes isolations regions 28, 30, and 32. Isolation region 28 is formed in P well 18, isolation region 30 is formed at the boundary between P well 18 and N well 16. Isolation region 32 is formed in N well 16. Also formed within P well 18 is a P well contact region 66, formed between isolation region 28 and the boundary of N well 16. P well contact region is a heavily doped p-type (P+) region. Also formed within N well 16 is an N well contact region 68 formed adjacent isolation region 32. N well contact region 68 is a heavily doped n-type (N+) region. As used herein, N+ and P+ regions refer to regions which are more heavily doped with their respective dopants as compared to n-type and p-type regions.

Also seen in the cross section of FIG. 1, is guard ring 20 and guard ring 22 located in bulk substrate 12, spaced apart from SOI block 24. An insulating layer 26 is formed over substrate 12 in SOI block 24 patterned with openings to expose guard rings 20 and 22 and to expose P well contact region 66 and N well contact region 68. Insulating layer 26 may be an oxide layer and may be referred to as a buried oxide layer (BOX). A semiconductor layer 34 is formed over insulating layer 26 in SOI block 24. SOI devices 46 and 48 are formed in and on semiconductor layer 34, above insulating layer 26. Semiconductor layer 34 can be any semiconductor material and provides the channel regions for SOI devices 46 and 48. Semiconductor layer 34 also includes openings which are lined up with the openings in insulating layer 26 that expose contact regions 66 and 68. Conductive contacts 36 and 38 are formed in these openings, respectively to provide and electrical contact to P well 18 and N well 16, respectively.

Semiconductor layer 34 also includes isolation regions 40, 42, and 44 that are lined up with isolation regions 28, 30, and 32. Isolation region 40 is between contact 36 and device 46, isolation region 42 is between devices 46 and 48, and isolation region 44 is between device 48 and contact 38. Device 46 includes a gate dielectric 54 over semiconductor layer 34, a gate electrode 52 over gate electrode 54, sidewall spacer 56 adjacent sidewalls of gate electrode 52 and gate dielectric 54, and source/drain regions 50 formed in semiconductor layer 34. Source/drain regions 50 are formed lateral to gate 52, and laterally extend under gate dielectric 54. Device 48 includes a gate dielectric 62 over semiconductor layer 34, a gate electrode 60 over gate electrode 62, sidewall spacer 64 adjacent sidewalls of gate electrode 60 and gate dielectric 62, and source/drain regions 58 formed in semiconductor layer 34. Source/drain regions 58 are formed lateral to gate 60, and laterally extend under gate dielectric 62. In the illustrated embodiment, both devices 46 and 48 are fully depleted devices whose source/drain regions extend fully from the surface of semiconductor layer 34 to insulating layer 26. Device 46 is formed over P Well 18 and device 48 is formed over N well 16.

Devices 46 and 48 can be any type of SOI devices. In a regular threshold voltage (RVT) type device, device 46 and device 48 are an n-type device and p-type device, respectively. In this case, source/drain regions 50 are N+ regions and source/drain regions 58 are P+ regions. That is, with an RVT type device, the n-type devices are formed over isolated P wells 18 and the p-type devices are formed over the N well 18. In a low threshold voltage (LVT) type device, devices 46 and device 48 are a p-type device and n-type device, respectively. In this case, source/drain regions 50 are P+ regions and source//drain regions 58 are N+ regions. Therefore, with LVT type devices, p-type devices are formed over isolated P well 18 and n-type devise are formed over N well 18.

Figure 3:
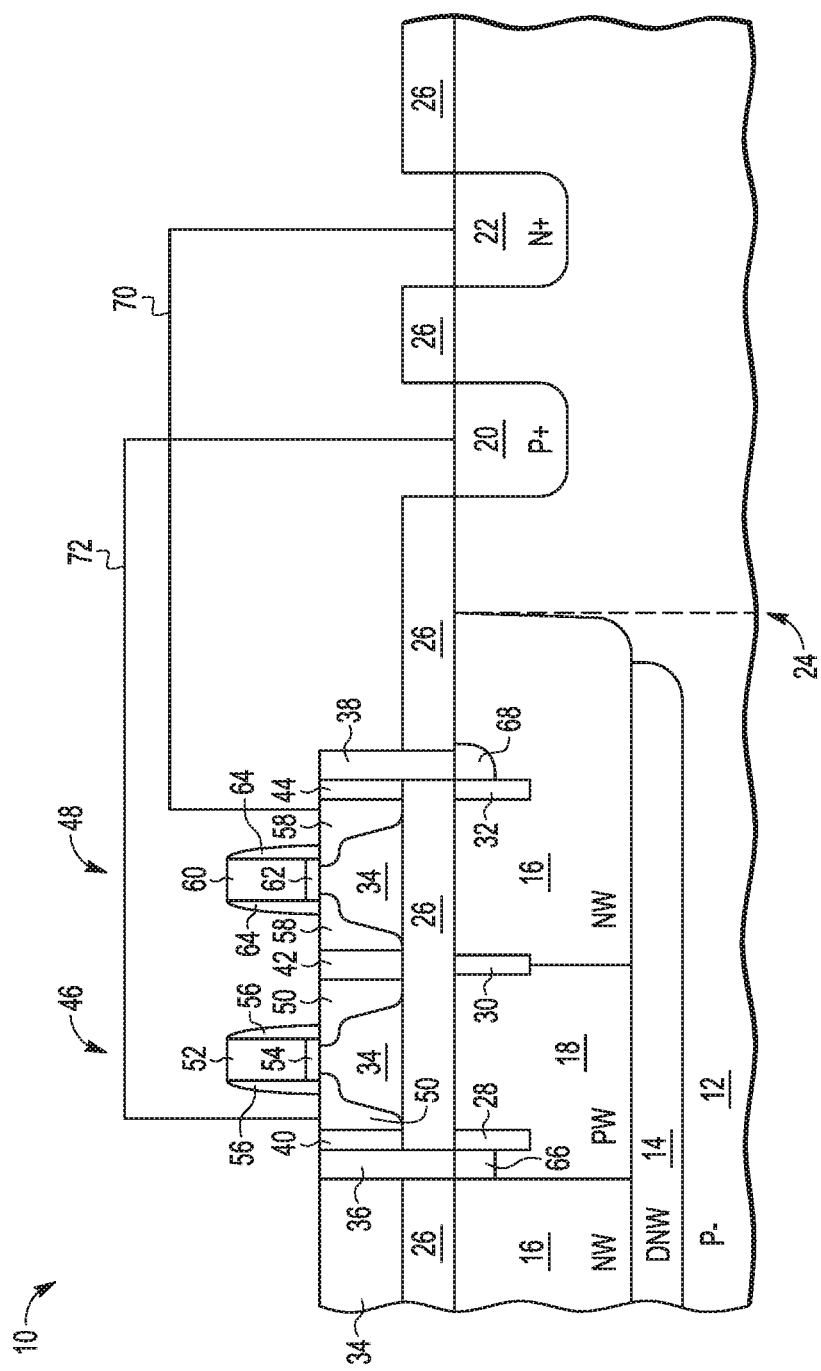
FIG. 3 illustrates, in a cross-sectional view, the semiconductor device of FIG. 2 with conductive traces, in accordance with one embodiment of the present invention.
Figure 4:
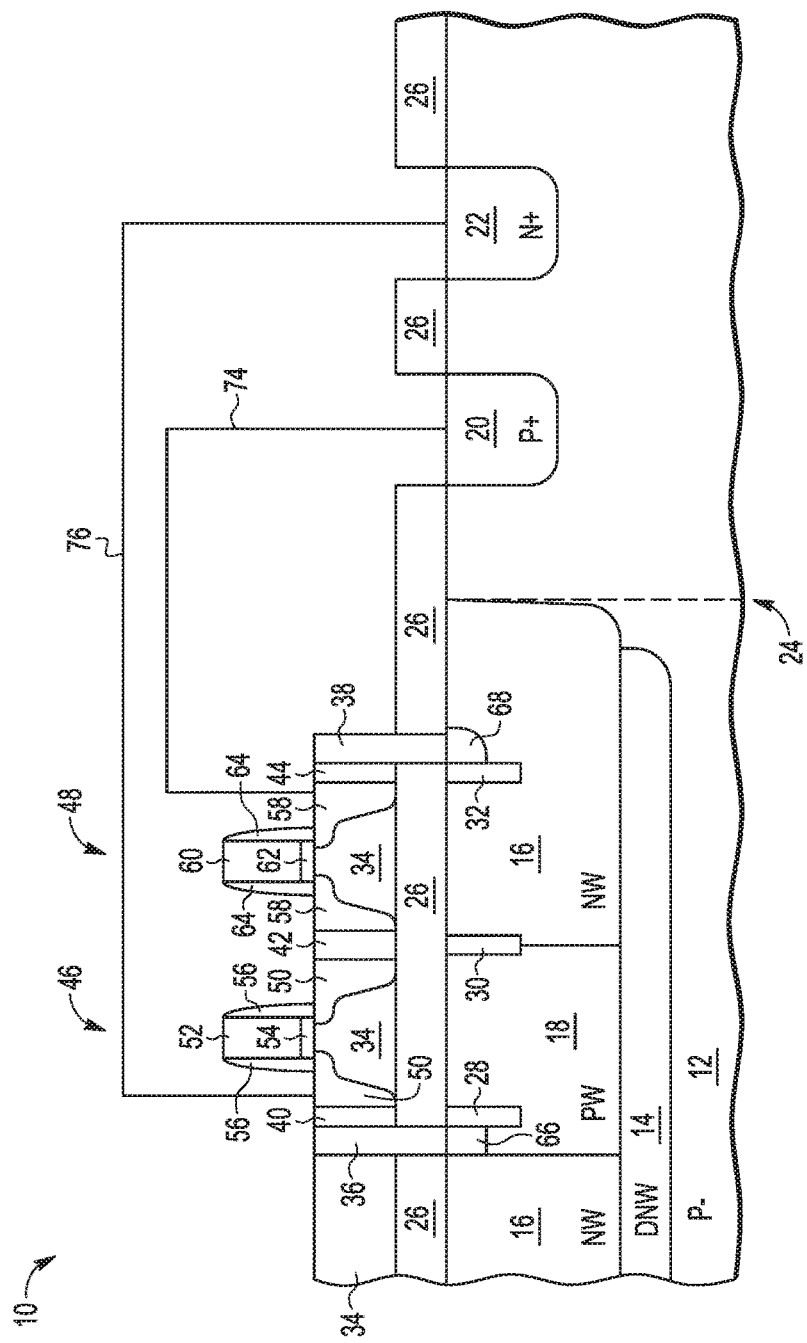
FIG. 4 illustrates, in a cross-sectional view, the semiconductor device of FIG. 2 with conductive traces, in accordance with one embodiment of the present invention

FIG. 3 illustrates connections for an RVT type device. In FIG. 3, it is assumed that device 10 is an RVT type device. An electrically conductive trace 72 electrically couples one of source/drain regions 50 to guard ring 20, and an electrically conductive trace 70 electrically couples one of source/drain regions 58 to guard ring 22. FIG. 4 illustrates connections for an LVT type device. In FIG. 4, it is assumed that device 10 is an RVT type device. An electrically conductive trace 74 electrically couples one of source/drain regions 58 to guard ring 20, and an electrically conductive trace 76 electrically couples one of source/drain regions 50 to guard ring 22.

In either the LVT or RVT embodiment, deep N well 14 and N well 16 are electrically coupled as well. Trace 72 in FIG. 3 and trace 74 in FIG. 4 electrically couple the ground of SOI block 24 to guard ring 20, and thus guard ring 20 forms a ground guard ring and the discharge drain for the ground net. Trace 70 in FIG. 3 and trace 76 electrically couple the VDD of SOI block 24 to guard ring 22, and thus guard ring 22 forms a discharge drain for the VDD net during manufacture. During operation, in either embodiment, the devices N+ diodes 22 are safely reverse biased and the P+ connections 20 tie the P-type bulk substrate to ground.

In an alternate embodiment, only one of guard rings 20 and 22 may be present. For example, referring to FIG. 3, in the case where a body bias on device 48 is not needed, in which N well 16 always has the same voltage as VDD, VDD can be coupled to N well 16 directly. In this case, trace 70 may electrically couple one of the source/drain regions 58 to N well contact region 68 rather than to guard ring 22. In this example, guard ring 22 would not need to be present.

By now it can be appreciated how guard rings 20 and 22 address the antenna effect, while not interfering with normal circuit operation. Guard rings 20 and 22 may be reversed, such that guard ring 20 is p-type and guard ring 22 is n-type, but so long as guard rings 20 and 22 are of opposite conductivity types, a diode is created. The guard rings allow for a diode with sufficient area such that, during manufacture, all accumulated charges go through p-type substrate 12 and gets dissipated and discharged through one of the two guard rings. Thus, device 10 is capable of avoiding the antenna effect. Furthermore, during operation, N well 16, and thus deep N well 14, can be set to any voltage as needed for biasing, and guard rings 20 and 22 still allow SOI block 24 to operate correctly. Also, guard rings 20 and 22 allow for either an RVT type configuration or LVT type configuration.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, guard rings 20 and 22 may have different shapes rather than a square or rectangular shape around the periphery of SOI block 24. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a semiconductor device includes a bulk substrate of a first conductivity type; a first semiconductor on insulator (SOI) block in the bulk substrate; a first well of the first conductivity type in the first SOI block; a second well of a second conductivity type in the first SOI block; a first guard ring of the first conductivity type in the first SOI block around at least a portion of a periphery of the first SOI block; a second guard ring of the second conductivity type in the first SOI block around at least a portion of the periphery of the first SOI block, wherein the first conductivity type is different than the second conductivity type. In one aspect, the semiconductor device further includes a deep well of the second conductivity type in the first SOI block under the first well and the second well. In another aspect, the semiconductor device further includes a bottom oxide layer over the bulk substrate but not over the first and second guard rings. In another aspect, the first and second guard rings are continuous and extend around the entire periphery of the first SOI block. In another aspect, the second guard ring is further from the first SOI block than the first guard ring. In another aspect, the semiconductor device further includes a first electronic device formed over a portion of the bottom oxide and the first well. In a further aspect, the semiconductor device further includes a second electronic device formed over another portion of the bottom oxide and the second well. In yet a further aspect, the first electronic device is a PMOS transistor and the second electronic device is an NMOS transistor. In another yet further aspect, the semiconductor device further includes a first conductive trace coupled between the second guard ring and a first current electrode of the first electronic device; and a second conductive trace coupled between the first guard ring and a first current electrode of the second electronic device. In another yet further aspect, the semiconductor device further includes a first conductive trace coupled between the second guard ring and a first current electrode of the second electronic device; and a second conductive trace coupled between the first guard ring and a first current electrode of the first electronic device. In another aspect of the embodiment, the semiconductor device further includes a second SOI block in the bulk silicon; a portion of the first and second guard rings are between the first SOI block and the second SOI block. In a further aspect, the semiconductor device further includes a third guard ring of the first conductivity type in the second SOI block around at least a portion of a periphery of the second SOI block; wherein a portion of the third guard ring is between the first SOI block and the second SOI block.

In another embodiment, a method for forming a semiconductor device includes delineating a portion of a bulk substrate having a first conductivity type as a first semiconductor on insulator (SOI) block; forming a first doped well of the first conductivity type in the first SOI block; forming a second doped well of a second conductivity type in the first SOI block; forming a first guard ring of the first conductivity type around at least a portion of a periphery of and spaced apart from the first SOI block; forming a first electronic device over the first doped well; forming a first electrically conductive trace between the first guard ring and a first current electrode of the first electronic device. In one aspect, the method further includes forming a second guard ring of the second conductivity type around at least a portion of a periphery of and spaced apart from the first guard ring; forming a second electronic device over the second doped well; forming a second electrically conductive trace between the second guard ring and a first current electrode of the second electronic device. In yet a further aspect, the method further includes forming a deep well of the second conductivity type in the first SOI block under the first well and the second well. In another yet further aspect, the method further includes forming a bottom oxide layer over the bulk substrate but not over at least a portion of the first and second guard rings, wherein the first and second electronic devices are formed over the bottom oxide layer. In another aspect, the first and second guard rings are continuous and extend around the entire periphery of the first SOI block.

In yet another embodiment, a semiconductor device includes an NMOS transistor formed on a first portion of an oxide layer, wherein the oxide layer is formed on a semiconductor on insulator (SOI) block of a bulk substrate; a PMOS transistor formed on a second portion of the oxide layer; a first doped ring formed in the bulk substrate and spaced at a distance from the SOI block; a second doped ring formed in the bulk substrate and spaced at a distance from the SOI block and the first guard ring; a first conductive trace connected between the first doped ring and a current electrode of the NMOS transistor; a second conductive trace connected between the second doped ring and a current electrode of the PMOS transistor. In one aspect, the first doped ring is of a first conductivity type; and the second doped ring is of a second conductivity type. In a further aspect, at least one of the first and second doped rings is not contiguous.

What is claimed is:
1. A method for forming a semiconductor device, comprising:
delineating a portion of a bulk substrate having a first conductivity type as a first semiconductor on insulator (SOI) block;
forming a first doped well of the first conductivity type in the first SOI block;
forming a second doped well of a second conductivity type in the first SOI block;
forming a first guard ring of the first conductivity type around at least a portion of a periphery of and laterally spaced apart from the first SOI block such that the first guard ring and the first SOI block do not touch;

forming a first electronic device directly over the first doped well;

forming a first electrically conductive trace between the first guard ring and a first current electrode of the first electronic device to electrically connect the first guard ring and the first current electrode of the first electronic device.

2. The method of claim 1, further comprising:

forming a second guard ring of the second conductivity type around at least a portion of a periphery of and laterally spaced apart from the first guard ring such that the first and second guard rings do not touch;

forming a second electronic device directly over the second doped well;

forming a second electrically conductive trace between the second guard ring and a first current electrode of the second electronic device.

3. The method of claim 2, further comprising forming a deep well of the second conductivity type in the first SOI block under the first well and the second well.

4. The method of claim 2, further comprising forming a bottom oxide layer over the bulk substrate but not over the first and second guard rings, wherein the first and second electronic devices are formed over the bottom oxide layer.

5. The method of claim 2, wherein the first and second guard rings are continuous and extend around the entire periphery of the first SOI block.

6. The method of claim 2, wherein:

the first electronic device is formed directly over a portion of the bottom oxide and the first doped well; and the second electronic device formed directly over another portion of the bottom oxide and the second doped well.

7. The method of claim 2, wherein at least one of the first and second guard rings is not contiguous.

8. The method of claim 2, further comprising:

forming a second SOI block in the bulk silicon, wherein a portion of the first and second guard rings are between the first SOI block and the second SOI block.

9. The method of claim 8, further comprising:

forming a third guard ring of the first conductivity type in the second SOI block around at least a portion of a periphery of the second SOI block, wherein a portion of the third guard ring is between the first SOI block and the second SOI block.

10. A method for forming a semiconductor device, comprising:

delineating a portion of a bulk substrate having a first conductivity type as a first semiconductor on insulator (SOI) block;

forming a first well of the first conductivity type in the first SOI block;

forming a second well of a second conductivity type in the first SOI block;

forming a first guard ring of the first conductivity type around at least a portion of a periphery of the first SOI block;

forming a second guard ring of the second conductivity type around at least a portion of a periphery of the first guard ring, wherein the first conductivity type is different from the second conductivity type;

forming a bottom oxide layer over the bulk substrate but not over the first and second guard rings;

forming a first electronic device directly over a portion of the bottom oxide and the first well; and forming a second electronic device directly over another portion of the bottom oxide and the second well.

11. The method of claim 10, further comprising:

forming a first electrically conductive trace between the first guard ring and a first current electrode of the first electronic device to electrically connect the first guard ring and the first current electrode of the first electronic device.

12. A method of claim 10, further comprising:

forming a deep well of the second conductivity type in the first SOI block under the first well and the second well.

13. A method of claim 10, wherein the first and second guard rings are continuous and extend around the entire periphery of the first SOI block.

14. A method of claim 10, wherein the second guard ring is further from the first SOI block than the first guard ring.

15. The method of claim 10, further comprising:

forming a first conductive trace coupled between the second guard ring and a first current electrode of the first electronic device; and forming a second conductive trace coupled between the first guard ring and a first current electrode of the second electronic device.

16. The method of claim 10, further comprising:

forming a first conductive trace coupled between the second guard ring and a first current electrode of the second electronic device; and forming a second conductive trace coupled between the first guard ring and a first current electrode of the first electronic device.

17. The method of claim 10, further comprising delineating another portion of the bulk substrate as a second SOI block, wherein a portion of the first and second guard rings are between the first SOI block and the second SOI block.

18. The method of claim 17, further comprising forming a third guard ring of the first conductivity type in the second SOI block around at least a portion of a periphery of the second SOI block, wherein a portion of the third guard ring is between the first SOI block and the second SOI block.

19. The method of claim 10, wherein the portion of the bottom oxide layer extends under all of the first electronic device and the another portion of the bottom oxide extends under all of the second electronic device.

* * * * *